United States Patent
Liu et al.

(10) Patent No.: US 11,588,015 B2
(45) Date of Patent: Feb. 21, 2023

(54) EPITAXIAL STRUCTURE

(71) Applicant: GlobalWafers Co., Ltd., Hsinchu (TW)

(72) Inventors: Jia-Zhe Liu, Hsinchu (TW); Yen-Lun Huang, Hsinchu (TW); Ying-Ru Shih, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 17/689,997

(22) Filed: Mar. 9, 2022

(65) Prior Publication Data

US 2022/0199763 A1 Jun. 23, 2022

Related U.S. Application Data

(62) Division of application No. 16/452,558, filed on Jun. 26, 2019, now Pat. No. 11,316,007.

(30) Foreign Application Priority Data

Aug. 1, 2018 (TW) .................................. 107126691

(51) Int. Cl.
| | | |
|---|---|---|
| *H01L 29/20* | (2006.01) | |
| *H01L 29/205* | (2006.01) | |
| *H01L 33/22* | (2010.01) | |
| *H01L 29/06* | (2006.01) | |
| *H01L 21/02* | (2006.01) | |
| *C30B 25/20* | (2006.01) | |

(52) U.S. Cl.
CPC ...... *H01L 29/0607* (2013.01); *H01L 29/2003* (2013.01); *H01L 29/205* (2013.01); *H01L 33/22* (2013.01); *C30B 25/20* (2013.01); *H01L 21/0254* (2013.01); *H01L 21/02458* (2013.01)

(58) Field of Classification Search
CPC .... H01L 29/2003; H01L 29/205; H01L 33/22
See application file for complete search history.

(56) References Cited

U.S. PATENT DOCUMENTS

| 6,649,287 B2 * | 11/2003 | Weeks, Jr. ........ H01L 21/02422 257/E21.127 |
| 9,252,220 B2 * | 2/2016 | Kim .................... H01L 21/0262 |
| 9,337,381 B2 * | 5/2016 | Kim ...................... H01L 33/382 |

\* cited by examiner

*Primary Examiner* — Phat X Cao
(74) *Attorney, Agent, or Firm* — JCIPRNET

(57) ABSTRACT

An epitaxial structure includes a substrate, a nucleation layer on the substrate, a buffer layer on the nucleation layer, and a nitride layer on the buffer layer. The nucleation layer consists of regions in a thickness direction, wherein a chemical composition of the regions is $Al_{(1-x)}In_xN$, where $0 \leq x \leq 1$. A maximum value of the x value in the plurality of regions is the same, a minimum value of the x value in the plurality of regions is the same, and an absolute value of a gradient slope of each of the regions is 0.1%/nm to 50%/nm. A thickness of the nucleation layer is less than a thickness of the buffer layer. A roughness of a surface of the nucleation layer in contact with the buffer layer is greater than a roughness of a surface of the buffer layer in contact with the nitride layer.

10 Claims, 5 Drawing Sheets

ID STRUCTURE

CROSS-REFERENCE TO RELATED APPLICATION

This application is a divisional application of and claims the priority benefit of U.S. patent application Ser. No. 16/452,558, filed on Jun. 26, 2019, now allowed. The prior application Ser. No. 16/452,558 claims the priority benefit of Taiwan application serial no. 107126691, filed on Aug. 1, 2018. The entirety of each of the above-mentioned patent applications is hereby incorporated by reference herein and made a part of this specification.

BACKGROUND

Technical Field

The disclosure relates to a semiconductor structure, and more particularly, to an epitaxial structure.

Description of Related Art

Since the film formed by the epitaxy process has advantages of high purity, good thickness control, etc., it has been widely applied to the production of radio-frequency (RF) components or power components.

In the epitaxial structure adopted in the general RF component, an aluminum nitride (AlN) layer as a nucleation layer is formed on the Si-substrate before the epitaxial process is performed. However, spontaneous polarization induced by the nucleation layer material itself often occurs at the interface between the nucleation layer and the Si-substrate, or lattice mismatch between the nucleation layer and the substrate may induce piezoelectric polarization, which results in the presence of a parasitic channel. As a result, the RF loss is increased. In addition, the aluminum atoms in the nucleation layer are prone to diffusion to the surface of the Si-substrate, which results in formation of a highly conductive layer, generates leakage current, and affects the RF component characteristics.

SUMMARY

The disclosure provides an epitaxial structure which can solve the diffusion of metal atoms in a nucleation layer to a substrate as in a conventional epitaxial structure, reduce the RF loss, and thus does not affect the RF component characteristics.

An epitaxial structure of the disclosure includes a substrate, a nucleation layer, a buffer layer, and a nitride layer. The nucleation layer is disposed on the substrate. The nucleation layer consists of a plurality of regions in a thickness direction, and a chemical composition of the regions is $Al_{(1-x)}In_xN$, where $0 \leq x \leq 1$, wherein a maximum value of the x value in the plurality of regions is the same, a minimum value of the x value in the plurality of regions is the same, and an absolute value of a gradient slope of each of the regions is 0.1%/nm to 50%/nm. The buffer layer is disposed on the nucleation layer, and the nitride layer is disposed on the buffer layer. A thickness of the nucleation layer is less than a thickness of the buffer layer. A roughness of a surface of the nucleation layer in contact with the buffer layer is greater than a roughness of a surface of the buffer layer in contact with the nitride layer.

In an embodiment of the disclosure, the absolute value of the gradient slope of each of the regions is 0.5%/nm to 10%/nm.

In an embodiment of the disclosure, an initial content of the x value of the nucleation layer is 10% to 100%, an end content of the x value is 0% to 90%, and an initial content of the (1-x) value is 0% to 90%, and an end content of the (1-x) value is 10% to 100%, wherein the initial content of the x value is located on a bottom portion of the nucleation layer close to the substrate, and the end content of the x value is located on a top portion of the nucleation layer close to the buffer layer.

In an embodiment of the disclosure, the initial content of the x value of the nucleation layer is 50% to 100%, the end content of the x value is 0% to 50%, the initial content of the (1-x) value is 0% to 50%, and the end content of the (1-x) value is 50% to 100%.

In an embodiment of the disclosure, the thickness of the nucleation layer is 1 nm to 500 nm.

In an embodiment of the disclosure, the thickness of the nucleation layer is 1 nm to 50 nm.

In an embodiment of the disclosure, a number of the plurality of regions of the nucleation layer is 2 to 100.

In an embodiment of the disclosure, a number of the plurality of regions of the nucleation layer is 2 to 20.

In an embodiment of the disclosure, the roughness of the surface of the nucleation layer in contact with the buffer layer is 1 nm to 10 nm.

In an embodiment of the disclosure, the roughness of the surface of the nucleation layer in contact with the buffer layer is 1 nm to 3 nm.

Based on the above, in the epitaxial structure of the disclosure, the nucleation layer includes a plurality of regions, the chemical composition of each of the regions is $Al_{(1-x)}In_xN$, and the x value has different types of variation along the thickness direction. Therefore, it is possible to solve the issue of the presence of the parasitic channel resulting from large spontaneous polarization as well as piezoelectric polarization generated by lattice mismatch in the nucleation layer and the Si-substrate in the conventional epitaxial structure. Moreover, it is also possible to solve the issue of reduced interface resistance caused by the diffusion of atoms of the nucleation layer to the Si-substrate, which further reduces the RF loss without affecting the RF component characteristics.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
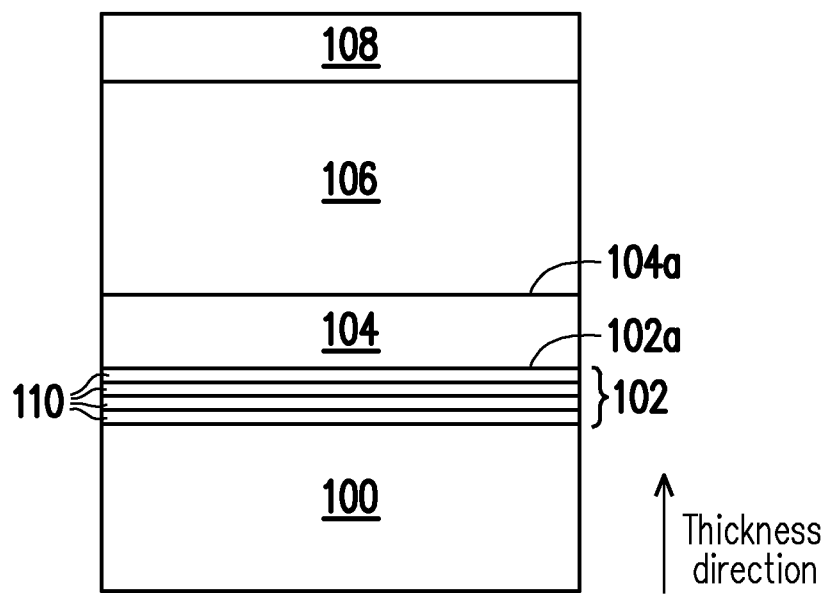
FIG. 1 is a schematic cross-sectional view of an epitaxial structure according to an embodiment of the disclosure.

Some embodiments are provided hereinafter and described in detail with reference to the accompanying drawings. However, the embodiments provided are not intended to limit the scope of the disclosure. Moreover, the drawings are only descriptive and are not drawn to scale. To facilitate understanding, the same components will hereinafter be denoted by the same reference numerals.

FIG. 1 is a schematic cross-sectional view of an epitaxial structure according to an embodiment of the disclosure.

Referring to FIG. 1, the epitaxial structure of the present embodiment includes a substrate 100, a nucleation layer 102, a buffer layer 104, a nitride layer 106, and a barrier layer 108. The material of the substrate 100 is, for example, Si, $Al_2O_3$, SiC, GaAs, or other suitable material.

The nucleation layer 102 is disposed on the substrate 100. The thickness of the nucleation layer 102 is less than the thickness of the buffer layer 104, and the roughness of a surface 102a of the nucleation layer 102 in contact with the buffer layer 104 is greater than the roughness of a surface 104a of the buffer layer 104 in contact with the nitride layer 106. The nucleation layer 102 consists of a plurality of regions 110 in the thickness direction. The chemical composition of the plurality of regions 110 is $Al_{(1-x)}In_xN$, where 0≤x≤1. The x value represents the In (indium) content, and the (1-x) value represents the Al (aluminum) content. In addition, in the description herein, a "region" is defined as a variation in the x value, but the number of the regions does not necessarily represent the number of layers. Due to the manufacturing process, one single layer structure may contain multiple variations in the x value. Therefore, one single layer may be composed of one single or a plurality of regions 110. Although four regions 110 are shown in FIG. 1, the disclosure is not limited thereto. In other embodiments, the number of the regions 110 is, for example, 2 to 100, or preferably, 2 to 20. In this range, more desirable interface quality and two-dimensional electron gas (2DEG) characteristics can be obtained. The roughness (rms) of the surface 102a of the nucleation layer 102 in contact with the buffer layer 104 is generally between 1 nm and 10 nm, or preferably, between 1 nm and 3 nm. In this range, more desirable interface quality and 2DEG characteristics can be obtained. The thickness of the nucleation layer 102 is, for example, 1 nm to 500 nm, or preferably, 1 nm to 200 nm. In this range, more desirable interface quality and 2DEG characteristics can be obtained. In the present embodiment, by disposing the nucleation layer 102, it is possible to reduce the amount of piezoelectric and spontaneous polarization, improve the highly conductive layer caused by the parasitic channel, reduce the stress of the epitaxial structure, adjust the warpage of the epitaxial structure after epitaxial growth, and improve the crack length.

The buffer layer 104 is disposed on the nucleation layer 102. The material of the buffer layer 104 is, for example, aluminum nitride (AlN). The roughness (rms) of the surface 104a of the buffer layer 104 in contact with the nitride layer 106 is, for example, between 0.2 nm and 3 nm and is less than the roughness of the surface 102a of the nucleation layer 102, which will contribute to subsequent epitaxial growth of the nitride layer 106. The thickness of the buffer layer 104 is generally greater than 500 nm. In the present embodiment, the buffer layer 104 is disposed in the epitaxial structure as a stress compensation adjustment and can adjust the warpage of the epitaxial structure after epitaxial growth to thereby improve the crack length. The nitride layer 106 is disposed on the buffer layer 104. The material of the nitride layer 106 is, for example, gallium nitride (GaN), aluminum nitride (AlN), indium nitride (InN), or aluminum gallium indium nitride (AlGaInN). In addition, in an embodiment, the epitaxial structure may also be provided with the barrier layer 108 on the nitride layer 106. The material of the barrier layer 108 is, for example, aluminum nitride (AlN), indium nitride (InN), aluminum gallium indium nitride (AlGaInN), or aluminum indium nitride (AlInN).

FIG. 2 to FIG. 10 are schematic views showing various content variations of a nucleation layer in an epitaxial structure of the above embodiment, where "content" refers to the x value.

Figure 2:
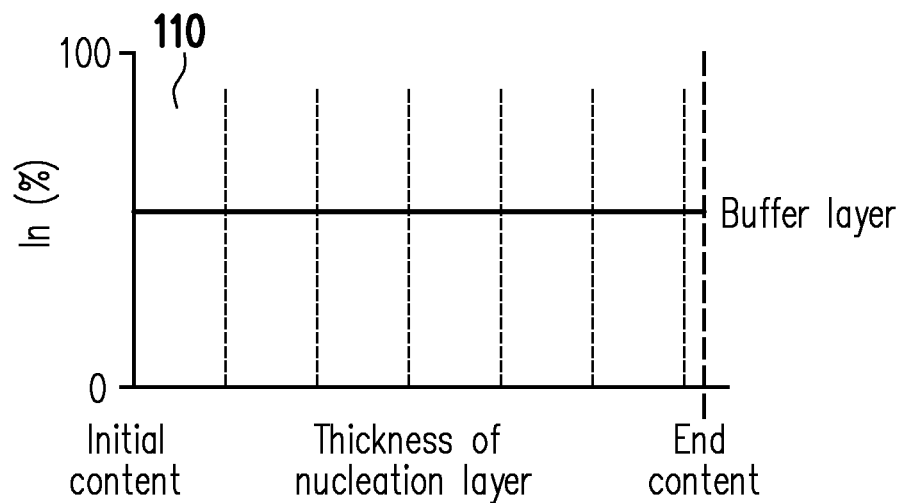
FIG. 2 is a schematic view showing a nucleation layer in a fixed content variation in an epitaxial structure according to the above embodiment.

FIG. 2 is a schematic view showing a nucleation layer in a fixed content variation. Referring to FIG. 2, the fixed content variation is defined as a variation in which the x value in the chemical composition $Al_{(1-x)}In_x$ of the plurality of regions 110 remains unchanged along the thickness direction of the nucleation layer, and the x value is not smaller than 10% (i.e., the indium content ratio is not smaller than 10%), or preferably not smaller than 60%. In this range, more desirable interface quality and 2DEG characteristics can be obtained. The thickness of the nucleation layer is, for example, 1 nm to 500 nm, or preferably 1 nm to 200 nm. The surface roughness of the nucleation layer is, for example, 1 nm to 10 nm, or preferably 1 nm to 3 nm. The process temperature of the nucleation layer is generally 500° C. to 850° C., or preferably 500° C. to 700° C. In this range, more desirable interface quality and 2DEG characteristics can be obtained.

Figure 3:
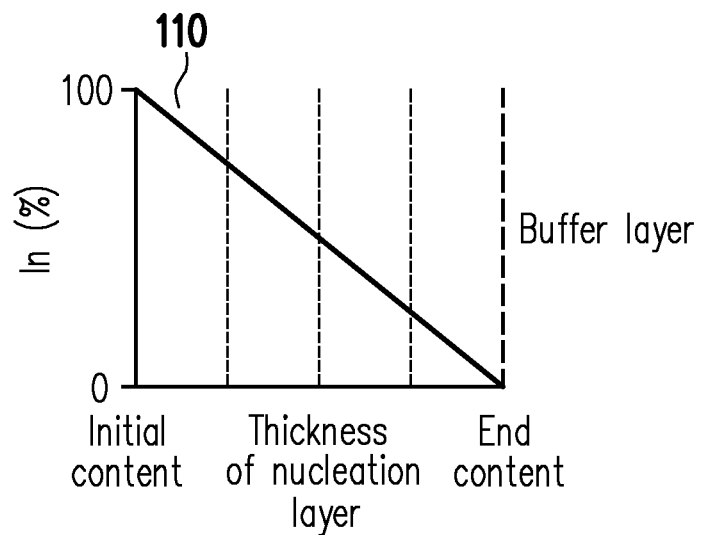
FIG. 3 is a schematic view showing a nucleation layer in a gradient content variation in an epitaxial structure according to the above embodiment.

FIG. 3 is a schematic view showing a nucleation layer in a gradient content variation. Referring to FIG. 3, the gradient content variation is defined as a variation in which the x value in the chemical composition $Al_{(1-x)}In_x N$ in the plurality of regions 110 decreases linearly along the thickness direction, and the gradient slope is, for example, −0.1%/nm to −50%/nm, or preferably −0.5%/nm to −10%/nm. In this range, more desirable interface quality and 2DEG characteristics can be obtained. Moreover, the initial content of the x value is, for example, 10% to 100%, or preferably 50% to 100%. In this range, more desirable interface quality and 2DEG characteristics can be obtained. The end content of the x value is, for example, 0% to 90%, or preferably 0% to 50%. In this range, more desirable interface quality and 2DEG characteristics can be obtained. The initial content of the (1-x) value is, for example, 0% to 90%, or preferably 0% to 50%, and the end content of the (1-x) value is, for example, 10% to 100%, or preferably 50% to 100%. The thickness of the nucleation layer is, for example, 1 nm to 500 nm, or preferably 1 nm to 200 nm, and the surface roughness of the nucleation layer is, for example, 1 nm to 10 nm, or preferably 1 nm to 3 nm.

In another embodiment, the x value has an initial content of 100% and an end content of 0%. The (1-x) value has an initial content of 0% and an end content of 100%.

Figure 4:
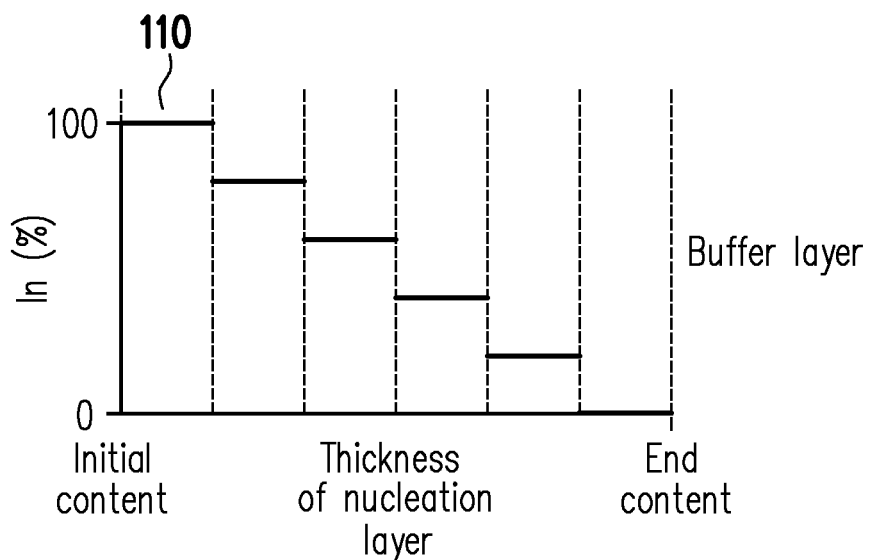
FIG. 4 is a schematic view showing a nucleation layer in a stepwise content variation in an epitaxial structure according to the above embodiment.

FIG. 4 is a schematic view showing a nucleation layer in a stepwise content variation. Referring to FIG. 4, the stepwise content variation is defined as a variation in which the x value in the chemical composition $Al_{(1-x)}In_xN$ in the plurality of regions 110 decreases stepwise along the thickness direction, the x value does not change along the thickness direction in each of the regions 110, and the stepwise slope of the plurality of regions 110 is −0.1%/loop to −50%/loop, or preferably −0.1%/loop to −20%/loop. In this range, more desirable interface quality and 2DEG characteristics can be obtained. Herein, the term "loop" means that there are two different contents (i.e., high and low contents) that are stacked periodically. Moreover, the initial content of the x value is, for example, 10% to 100%, or preferably 50% to 100%, and the end content of the x value is, for example, 0% to 90%, or preferably 0% to 50%. The initial content of the (1-x) value is, for example, 0% to 90%, or preferably 0% to 50%, and the end content of the (1-x) value is, for example, 10% to 100%, or preferably 50% to 100%. The thickness of the nucleation layer is, for example, 1 nm to 500 nm, or preferably 1 nm to 50 nm. The number of the regions 110 in the nucleation layer is 2 to 100, or preferably 2 to 20. In this range, more desirable interface quality and 2DEG characteristics can be obtained. The surface roughness of the nucleation layer is, for example, 1 nm to 10 nm, or preferably 1 nm to 3 nm.

Figure 5:
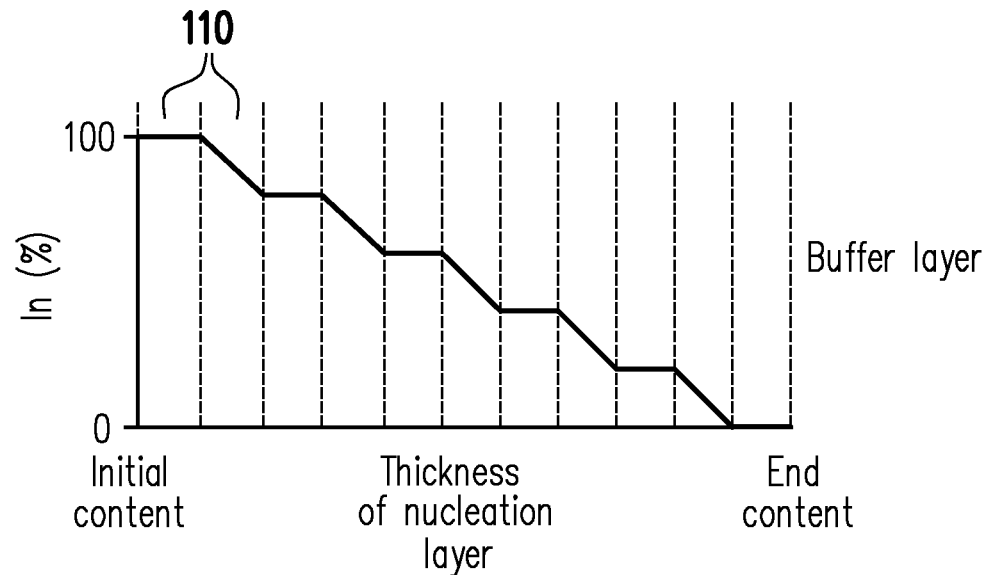
FIG. 5 is a schematic view showing a nucleation layer in a stepwise gradient content variation in an epitaxial structure according to the above embodiment.

FIG. 5 is a schematic view showing a nucleation layer in a stepwise gradient content variation. Referring to FIG. 5, the stepwise gradient content variation is defined as a variation in which the maximum value of the x value in the chemical composition $Al_{(1-x)}In_xN$ in the plurality of regions 110 decreases along the thickness direction, and the x value in the chemical composition of each two regions 110 consists of a fixed region and a gradient region. In other words, each two regions 110 are composed of a fixed region having the x value as a fixed value and a gradient region having the x value decreasing linearly. In FIG. 5, the x value of the fixed regions decreases stepwise, and the stepwise slope of the fixed regions is, for example,−0.1%/loop to −50%/loop, or preferably −0.1%/loop to −20%/loop. The gradient slope of the gradient regions is, for example, −0.1%/nm to −50%/nm, or preferably −0.5%/nm to −10%/nm.

In the stepwise gradient variation, the initial content of the x value is, for example, 10% to 100%, or preferably 50% to 100%, and the end content of the x value is, for example, 0% to 90%, or preferably 0% to 50%. The initial content of the (1-x) value is, for example, 0% to 90%, or preferably 0% to 50%, and the end content of the (1-x) value is, for example, 10% to 100%, or preferably 50% to 100%. The thickness of the nucleation layer is, for example, 1 nm to 500 nm, or preferably 1 nm to 50 nm, and the number of the regions 110 of the nucleation layer is, for example, 2 to 100, or preferably 2 to 20. The surface roughness of the nucleation layer is, for example, 1 nm to 10 nm, or preferably 1 nm to 3 nm.

Figure 6:
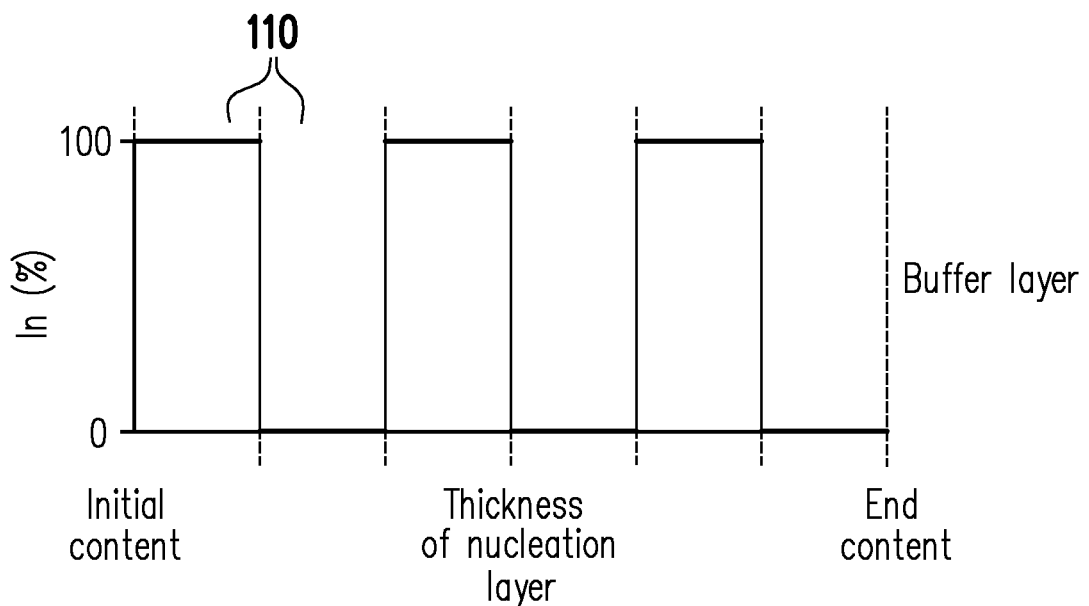
FIG. 6 is a schematic view showing a nucleation layer in a periodic content variation in an epitaxial structure according to the above embodiment.

FIG. 6 is a schematic view showing a nucleation layer in a periodic content variation. Referring to FIG. 6, the x values in the chemical composition of each two regions 110 are respectively two fixed values and are stacked along the thickness direction. The initial content of the x value is, for example, 10% to 100%, or preferably 50% to 100%, and the end content of the x value is, for example, 0% to 90%, or preferably 0% to 50%. Herein, the term "initial content" refers to the contact end between the nucleation layer and the substrate as the initial position, and "end content" refers to the contact end between the nucleation layer and the buffer layer as the end position. The initial content of the (1-x) value is, for example, 0% to 90%, or preferably 0% to 50%, and the end content of the (1-x) value is, for example, 10% to 100%, or preferably 50% to 100%. The thickness of the nucleation layer is, for example, 1 nm to 500 nm, or preferably 1 nm to 50 nm, and the number of the regions 110 of the nucleation layer is, for example, 2 to 100, or preferably 2 to 20. The surface roughness of the nucleation layer is, for example, 1 nm to 10 nm, or preferably 1 nm to 3 nm.

Figure 7:
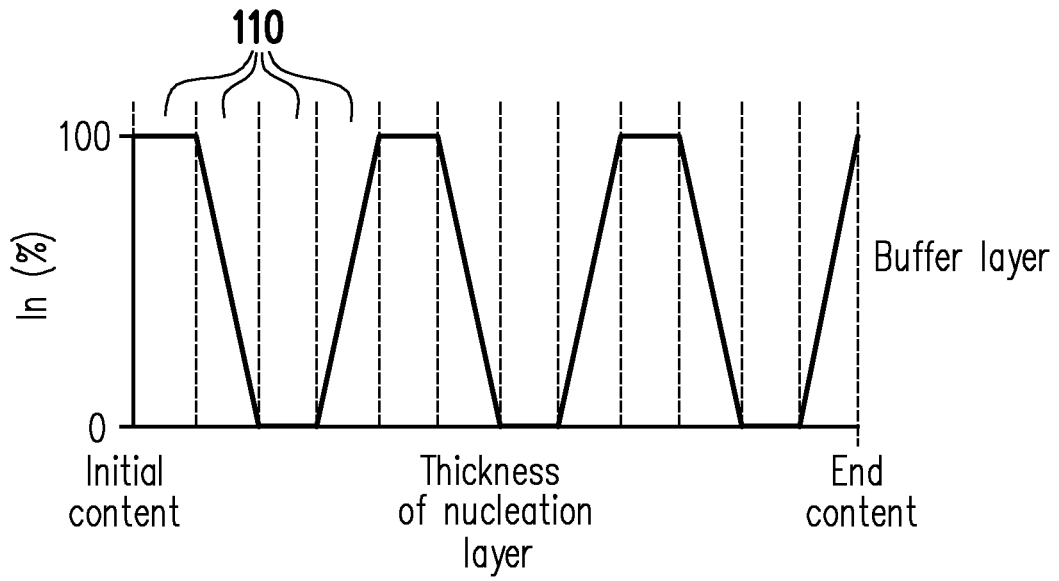
FIG. 7 is a schematic view showing a nucleation layer in a periodic gradient content variation in an epitaxial structure according to the above embodiment.

FIG. 7 is a schematic view showing a nucleation layer in a periodic gradient content variation. Referring to FIG. 7, the periodic gradient content variation is defined as a variation in which the x value increases or decreases periodically and gradually along the thickness direction. For example, the x value in the chemical composition $Al_{(1-x)}In_xN$ of each four regions 110 in the nucleation layer consists of four sections of variation along the thickness direction, and the four sections of variation include: a first fixed region having a fixed value which is the maximum value, a first gradient region gradually changing from the maximum value to the maximum value, a second fixed region having another fixed value which is the minimum value, and a second gradient region gradually changing from the minimum value to the maximum value. The absolute value of the gradient slope of the first gradient region and the second gradient region is, for example, 0.1%/nm to 50%/nm, or preferably 0.5%/nm to 10%/nm.

In the periodic gradient variation, the initial content of the x value is, for example, 10% to 100%, or preferably 50% to 100%, and the end content of the x value is, for example, 0% to 90%, or preferably 0% to 50%. The initial content of the (1-x) value is, for example, 0% to 90%, or preferably 0% to 50%, and the end content of the (1-x) value is, for example, 10% to 100%, or preferably 50% to 100%. The thickness of the nucleation layer is, for example, 1 nm to 500 nm, or preferably 1 nm to 50 nm, and the number of the regions 110 of the nucleation layer is, for example, 4 to 100, or preferably 4 to 20. The surface roughness of the nucleation layer is, for example, 1 nm to 10 nm, or preferably 1 nm to 3 nm.

Figure 8:
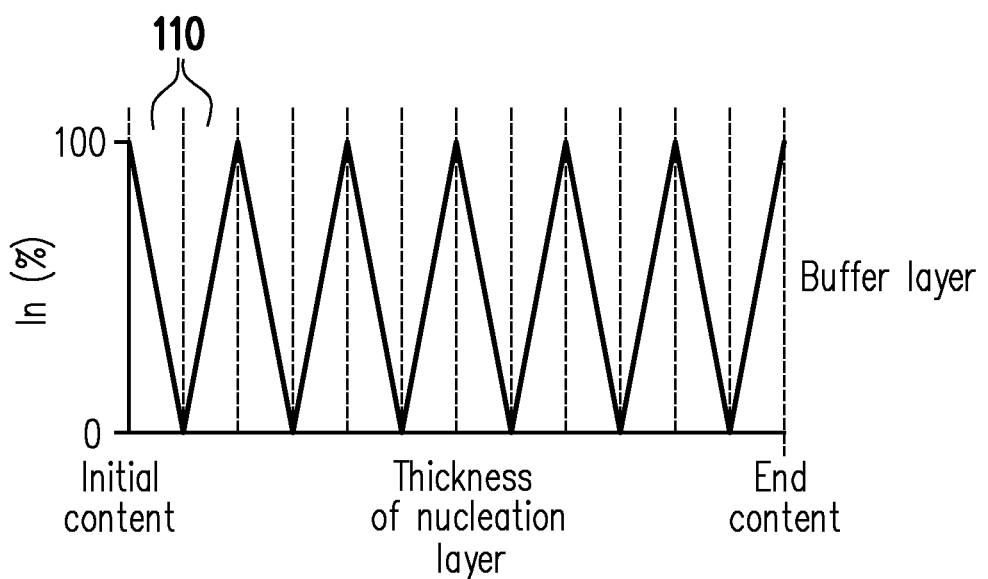
FIG. 8 is a schematic view showing a nucleation layer in a fully gradient content variation in an epitaxial structure according to the above embodiment.
Figure 9:
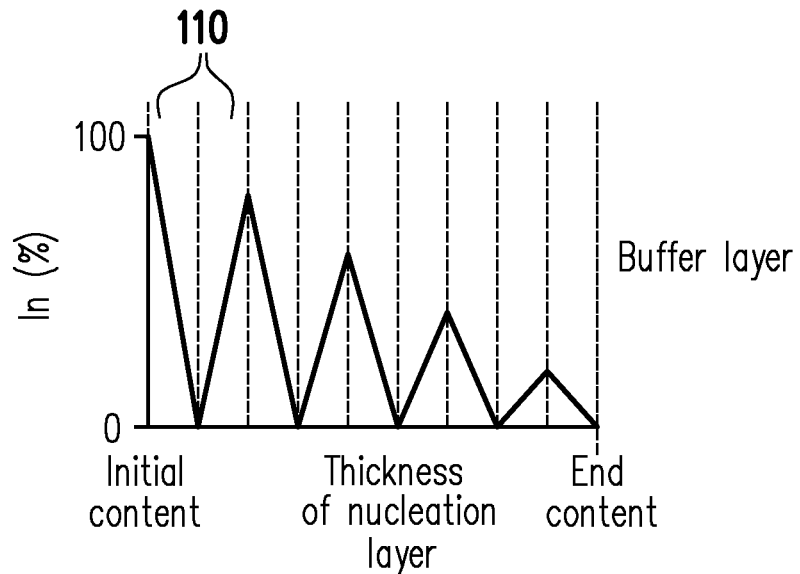
FIG. 9 is a schematic view showing a nucleation layer in another fully gradient content variation in an epitaxial structure according to the above embodiment.
Figure 10:
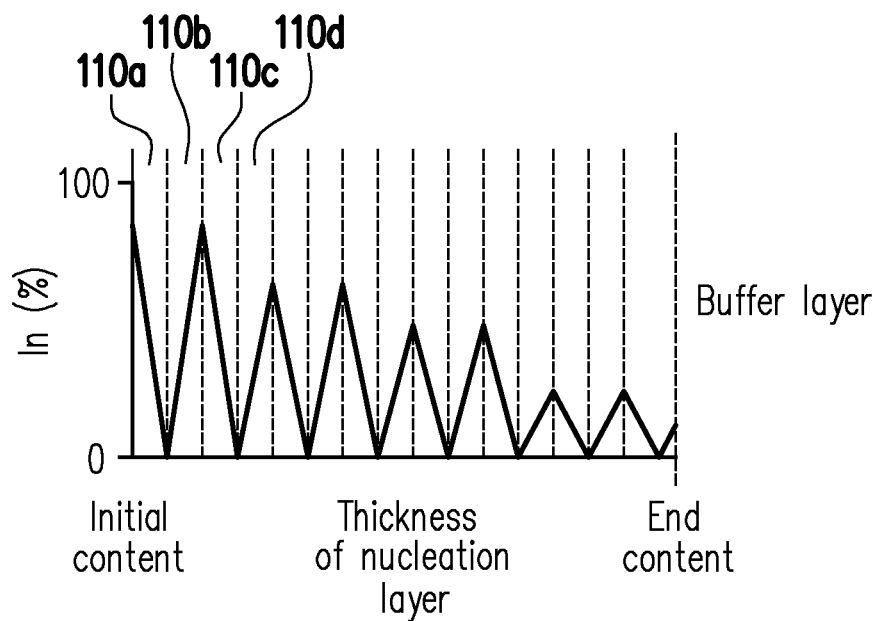
FIG. 10 is a schematic view showing a nucleation layer in still another fully gradient content variation in an epitaxial structure according to the above embodiment.

FIG. 8, FIG. 9, and FIG. 10 are schematic views showing a nucleation layer in three fully gradient content variations.

The fully gradient content variation is defined as a variation in which the x value in the chemical composition of each of the regions 110 increases or decreases fully gradually along the thickness direction.

Referring to FIG. 8, the maximum value of the x value in the regions 110 is the same, and the minimum value of the x value is the same. Moreover, the absolute value of the gradient slope of each of the regions 110 is, for example, 0.1%/nm to 50%/nm, or preferably 0.5%/nm to 10%/nm. The initial content of the x value is, for example, 10% to 100%, or preferably 50% to 100%, and the end content of the x value is, for example, 0% to 90%, or preferably 0% to 50%. The initial content of the (1-x) value is, for example, 0% to 90%, or preferably 0% to 50%, and the end content of the (1-x) value is, for example, 10% to 100%, or preferably 50% to 100%. The thickness of the nucleation layer is, for example, 1 nm to 500 nm, or preferably 1 nm to 50 nm. The number of the regions 110 of the nucleation layer is, for example, 2 to 100, or preferably 2 to 20. The surface roughness of the nucleation layer is, for example, 1 nm to 10 nm, or preferably 1 nm to 3 nm.

In FIG. 9, the maximum value of the x value in the plurality of regions 110 decreases along the thickness direction, and the minimum value of the x value is the same. The absolute value of the gradient slope of each of the regions 110 is, for example, 0.1%/nm to 50%/nm, or preferably 0.5%/nm to 10%/nm, and the absolute value of the stepwise slope of the regions 110 is, for example, 0.1%/loop to 50%/loop, or preferably 0.5%/loop to 10%/loop. The initial content of the x value is, for example, 10% to 100%, or preferably 50% to 100%, and the end content of the x value is, for example, 0% to 90%, or preferably 0% to 50%. The initial content of the (1-x) value is, for example, 0% to 90%, or preferably 0% to 50%, and the end content of the (1-x) value is, for example, 10% to 100%, or preferably 50% to 100%. The thickness of the nucleation layer is, for example, 1 nm to 500 nm, or preferably 1 nm to 50 nm, and the number of the regions 110 of the nucleation layer is, for example, 2 to 100, or preferably 2 to 20. The surface roughness of the nucleation layer is, for example, 1 nm to 10 nm, or preferably 1 nm to 3 nm.

In FIG. 10, the maximum value of the x value in a plurality of regions 110a to 110d decreases along the thickness direction, the minimum value of the x value is the same, and the x value in the chemical composition of the four regions 110a to 110d consists of four sections of variation. The four sections of variation include: the first gradient region 110a gradually changing from the maximum value to the minimum value, the second gradient region 110b gradually changing from the minimum value to the maximum value, the third gradient region 110c gradually changing from the maximum value to the minimum value, and the fourth gradient region 110d gradually changing from the minimum value to the maximum value. The maximum value of the x value is the same in the first gradient region 110a, the second gradient region 110b, and the third gradient region 110c. The maximum value of the x value in the fourth gradient region 110d is a value that decreases from the maximum value of the x value of the first gradient region 110a (the second gradient region 110b and the third gradient region 110c) at a stepwise slope of −0.1%/loop to −50%/loop, and the stepwise slope is preferably −0.5%/loop to −10%/loop. The absolute value of the gradient slope of each of the regions 110a to 110d is, for example, 0.1%/nm to 50%/nm, or preferably 0.5%/nm to 10%/nm.

In FIG. 10, the initial content of the x value is, for example, 10% to 100%, or preferably 50% to 100%, and the end content of the x value is, for example, 0% to 90%, or preferably 0% to 50%. The initial content of the (1-x) value is, for example, 0% to 90%, or preferably 0% to 50%, and the end content of the (1-x) value is, for example, 10% to 100%, or preferably 50% to 100%. The thickness of the nucleation layer is, for example, 1 nm to 500 nm, or preferably 1 nm to 50 nm. The number of the regions 110a to 110d of the nucleation layer is, for example, 4 to 100, or preferably 4 to 20. In this range, more desirable interface quality and 2DEG characteristics can be obtained. The surface roughness of the nucleation layer is, for example, 1 nm to 10 nm, or preferably 1 nm to 3 nm.

From the perspective of solving the RF loss, the embodiments of FIG. 8 to FIG. 10 are preferred. The reason is that since the interface of the nucleation layer and the buffer layer is a continuous variation, the defect density of the interface can be reduced, and the quality of the epitaxial material and the interface smoothness can be improved. In addition, since the interface is a continuous variation, the interface stress generated is small, and the amount of polarization is relatively low, which can effectively improve the highly conductive layer caused by the parasitic channel and thereby reduce the RF loss.

In summary of the above, according to the epitaxial structure of the disclosure, the issue of the conventional nucleation layer (AlN) can be improved through the different content (x value) variations in the nucleation layer of $Al_{(1-x)}In_xN$. Table 1 below shows the expected RF characteristics of the conventional nucleation layer and the nucleation layer of the disclosure applied to the epitaxial structure.

TABLE 1

|  | Conventional nucleation layer AlN | Nucleation layer of the disclosure $Al_{(1-x)}In_xN$ |
| --- | --- | --- |
| Lattice matching | Inferior | Superior |
| Spontaneous polarization | High | Low |
| Charge induced by spontaneous polarization | Much | Little |
| Piezoelectric polarization | High | Low |
| Charge induced by piezoelectric polarization | Much | Little |
| Total amount of polarization | High | Low |
| Al diffusion coefficient in Si-substrate | High | Low |

According to Table 1, since the nucleation layer of the disclosure has better lattice matching with the Si-substrate, lower spontaneous polarization, and lower piezoelectric polarization, and can reduce the diffusion of aluminum in the Si-substrate, it is possible to reduce the RF loss and ensure the RF characteristics.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. An epitaxial structure comprising:
  a substrate;
  a nucleation layer disposed on the substrate, wherein the nucleation layer consists of a plurality of regions in a thickness direction, and a chemical composition of the plurality of regions is $Al_{(1-x)}In_xN$, where $0 \leq x \leq 1$, wherein a maximum value of the x value in the plurality of regions is the same, a minimum value of the x value in the plurality of regions is the same, and an absolute value of a gradient slope of each of the regions is 0.1%/nm to 50%/nm;
  a buffer layer disposed on the nucleation layer, wherein a thickness of the nucleation layer is less than a thickness of the buffer layer; and
  a nitride layer disposed on the buffer layer, wherein a roughness of a surface of the nucleation layer in contact with the buffer layer is greater than a roughness of a surface of the buffer layer in contact with the nitride layer.

2. The epitaxial structure according to claim 1, wherein the absolute value of the gradient slope of each of the regions is 0.5%/nm to 10%/nm.

3. The epitaxial structure according to claim 1, wherein an initial content of the x value of the nucleation layer is 10% to 100%, an end content of the x value is 0% to 90%, and an initial content of the (1-x) value is 0% to 90%, and an end content of the (1-x) value is 10% to 100%, wherein the initial content of the x value is located on a bottom portion of the nucleation layer close to the substrate, and the end content of the x value is located on a top portion of the nucleation layer close to the buffer layer.

4. The epitaxial structure according to claim 3, wherein the initial content of the x value of the nucleation layer is 50% to 100%, the end content of the x value is 0% to 50%, the initial content of the (1-x) value is 0% to 50%, and the end content of the (1-x) value is 50% to 100%.

5. The epitaxial structure according to claim 1, wherein the thickness of the nucleation layer is 1 nm to 500 nm.

6. The epitaxial structure according to claim 5, wherein the thickness of the nucleation layer is 1 nm to 50 nm.

7. The epitaxial structure according to claim 1, wherein a number of the plurality of regions of the nucleation layer is 2 to 100.

8. The epitaxial structure according to claim 7, wherein the number of the plurality of regions of the nucleation layer is 2 to 20.

9. The epitaxial structure according to claim 1, wherein the roughness of the surface of the nucleation layer in contact with the buffer layer is 1 nm to 10 nm.

10. The epitaxial structure according to claim 9, wherein the roughness of the surface of the nucleation layer in contact with the buffer layer is 1 nm to 3 nm.

\* \* \* \* \*